(12) United States Patent
Chen et al.

(10) Patent No.: US 12,080,543 B2
(45) Date of Patent: Sep. 3, 2024

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Yuanpeng Chen, Shenzhen (CN); Yuanjun Hsu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/622,617

(22) PCT Filed: Dec. 16, 2021

(86) PCT No.: PCT/CN2021/138885
§ 371 (c)(1),
(2) Date: Dec. 23, 2021

(87) PCT Pub. No.: WO2023/103016
PCT Pub. Date: Jun. 15, 2023

(65) Prior Publication Data
US 2024/0030225 A1  Jan. 25, 2024

(30) Foreign Application Priority Data

Dec. 9, 2021  (CN) .................. 202111498839.9

(51) Int. Cl.
*H01L 27/12* (2006.01)
*H01L 23/532* (2006.01)

(52) U.S. Cl.
CPC .... H01L 27/1225 (2013.01); H01L 23/53214 (2013.01); H01L 23/53228 (2013.01); H01L 27/127 (2013.01)

(58) Field of Classification Search
None
See application file for complete search history.

(56) References Cited

U.S. PATENT DOCUMENTS

2014/0246711 A1* 9/2014 Amari ................ H01L 27/1259
 438/34
2019/0189719 A1* 6/2019 Bai ........................ H10K 71/00
(Continued)

*Primary Examiner* — Benjamin P Sandvik
(74) *Attorney, Agent, or Firm* — The Roy Gross Law Firm, LLC; Roy Gross (57) ABSTRACT

A display panel includes a substrate, a first metal layer, and a first insulating layer, an oxide semiconductor layer, a second insulating layer, a second metal layer, a third insulating layer, and a third metal layer stacked on each other sequentially. The first insulating layer includes a first region and a second region adjacent to the first region, and a thickness of the second region is less than a thickness of the first region. A projection of at least a portion of the oxide semiconductor layer projected on the substrate overlaps with a projection of the first metal layer projected on the substrate. The third metal layer is connected to the first metal layer through a third via hole, and the third via hole is extended through the first insulating layer and the third insulating layer.

16 Claims, 4 Drawing Sheets

(56) References Cited

U.S. PATENT DOCUMENTS

2020/0212221 A1\* 7/2020 Baeck .............. H01L 29/78627
2022/0406942 A1\* 12/2022 Kikuchi ............ H01L 29/78696
2023/0215876 A1\* 7/2023 Suzuki ............... H01L 29/7869
                                                              257/59

\* cited by examiner

DISPLAY PANEL AND MANUFACTURING METHOD THEREOF

CROSS REFERENCE TO RELATED APPLICATIONS

This application is a National Phase of PCT Patent Application No. PCT/CN2021/138885 having International filing date of Dec. 16, 2021, which claims the benefit of priority of Chinese Application No. 202111498839.9 filed on Dec. 9, 2021. The contents of the above applications are all incorporated by reference as if fully set forth herein in their entirety.

FIELD OF DISCLOSURE

The present invention relates to a field of display technology and in particular, to a display panel and a manufacturing method thereof.

DESCRIPTION OF RELATED ART

Oxide semiconductors (e.g., indium gallium zinc oxide, IGZO) are used in AMOLEDs (active-matrix organic light emitting diodes) displays as an active layer of a semiconductor on the array substrate due to their excellent performance and combined advantages in mobility, large area uniformity, and costs compared to amorphous silicon (A-Si) and low-temperature polycrystalline silicon (LTPS). Especially, large-sized displays (e.g., TV) have high standard requirements for parasitic capacitance of TFT (thin film transistor) devices, and the parasitic capacitance resulting from large-sized devices and wiring can cause high resistive-capacitive delay (RC-Delay), thus reducing panel display performance.

Compared to IGZO TFT devices with a bottom gate structure, a top gate structure will largely reduce a problem of high parasitic capacitance caused by the overlapping of a gate electrode and a source/drain electrode. Top gate (TG) type IGZO devices require etching gate insulation (GI) layer in a specific area of an active semiconductor layer and conductorization of this specific area to facilitate good contact and reduce electrical resistance. In large-sized AMOLED displays, non-uniformity in processes often leads to non-uniform display images in products, resulting in degradation of display performance.

SUMMARY

It is an object of the present invention to provide a display panel and a manufacturing method thereof that uses an increased second insulating layer over-etching process to improve the uniformity of the second insulating layer etching and conductorization of the oxide conductor layer, thereby enhancing the display quality of the display panel.

Accordingly, the present invention provides a display panel comprises a substrate, an oxide semiconductor layer, a second insulating layer, and a third metal layer. A first metal layer and a first insulating layer are disposed sequentially on the substrate. The first insulating layer comprises a first region and a second region adjacent to the first region, wherein a thickness of the second region is less than a thickness of the first region. An oxide semiconductor layer is disposed on a surface of the first region of the first insulating layer away from the first metal layer, wherein a projection of at least a portion of the oxide semiconductor layer projected on the substrate overlaps with a projection of the first metal layer projected on the substrate. A second insulating layer is disposed on a surface of the oxide semiconductor layer away from the first insulating layer, and a second metal layer and a third insulating layer are disposed sequentially on the second insulating layer. A third metal layer is disposed on a surface of the third insulating layer away from the second metal layer. The third metal layer is electrically connected to the oxide semiconductor layer through a first via hole and a second via hole. The third metal layer is connected to the first metal layer through a third via hole in the second region, wherein the third via hole is extended through the first insulating layer and the third insulating layer.

Preferably, the first metal layer is a shielding metal layer, the first insulating layer is an inorganic buffer layer, the oxide semiconductor layer is an active layer, the second insulating layer is a gate insulating layer, the second metal layer is a gate, the third insulating layer is an inter-layer dielectric layer, and the third metal layer is a source/drain layer.

Preferably, the second metal layer comprises a first transition metal portion and a first metal material portion arranged on the first transition metal portion.

Preferably, a material of the first transition metal portion is molybdenum, titanium, tungsten, chromium, nickel, or a combination thereof, and a material of the first metal material portion is copper or aluminum.

Preferably, the third metal layer comprises a second transition metal portion and a second metal material portion arranged on the second transition metal portion.

Preferably, a material of the second transition metal portion is molybdenum, titanium, tungsten, chromium, nickel, or a combination thereof, and a material of the second metal material portion is copper or aluminum.

Preferably, the display panel further comprises a passivation layer covering the third insulating layer and the third metal layer, and the passivation layer has a thickness of 1000 Å to 5000 Å.

Preferably, the projection of the oxide semiconductor layer projected on the substrate coincides with the projection of the first metal layer projected on the substrate.

Moreover, the present invention further a manufacturing method of a display panel, comprises following steps:

providing a substrate on which a first metal layer and a first insulating layer sequentially are deposited, wherein the first insulating layer comprises a first region and a second region adjacent to the first region, and a thickness of the second region is less than a thickness of the first region;

depositing an oxide semiconductor layer on a surface of the first region of the first insulating layer away from the first metal layer, wherein a projection of at least one portion of the oxide semiconductor layer projected on the substrate overlaps with a projection of the first metal layer projected on the substrate;

depositing a second insulating layer on a surface of the oxide semiconductor layer away from the first insulating layer, and sequentially depositing a second metal layer and a third insulating layer on the second insulating layer; and depositing a third metal layer on a surface of the third insulating layer away from the second metal layer, wherein the third metal layer is electrically connected to the oxide semiconductor layer through a first via hole and a second via hole, wherein the third metal layer is connected to the first metal layer through a third via hole defined in the second region, and the third via hole is extended through the first insulating layer and the third insulating layer.

Preferably, the first metal layer is a shielding metal layer, the first insulating layer is an inorganic buffer layer, the oxide semiconductor layer is an active layer, the second insulating layer is a gate insulating layer, the second metal layer is a gate, the third insulating layer is an inter-layer dielectric layer, and the third metal layer is a source/drain layer.

Preferably, the second metal layer comprises a first transition metal portion and a first metal material portion arranged on the first transition metal portion.

Preferably, a material of the first transition metal portion is molybdenum, titanium, tungsten, chromium, nickel, or a combination thereof and has a thickness of 50 Å to 500 Å, and a material of the first metal material portion is copper or aluminum and has a thickness of 2000 Å to 5000 Å.

Preferably, the third metal layer comprises a second transition metal portion and a second metal material portion arranged on the second transition metal portion.

Preferably, the display panel further comprises a passivation layer covering the third insulating layer and the third metal layer, and the passivation layer has a thickness of 1000 Å to 5000 Å.

Preferably, the projection of the oxide semiconductor layer projected on the substrate coincides with the projection of the first metal layer projected on the substrate.

Advantages of the Present Application

The present invention further has the following advantages. The present invention performs an over-etching process in the second insulating layer to form a certain degree of etching on the first insulating layer. Under the premise of ensuring that the second insulating layer is completely etched, the whole surface of the oxide semiconductor layer obtains high uniformity and high mobility features, so that the TFT electrical stability is high, and the display quality of the display panel is effectively improved. In addition, the over-etching process of the second insulating layer can reduce a work load to etch and form the third via hole in the first insulating layer in a subsequent process, which ensures a good contact between the third metal layer and the first metal layer, and keeps the light-shielding characteristics of the first metal layer without affecting saturation mobility characteristics of the TFT. Specifically, in manufacturing a top-gate type IGZO TFT of the present invention, uniform conductorization of the oxide semiconductor layer is ensured by the over-etching process of the second insulating layer, and the over-etching process forms the first region and the second region with different thicknesses, thus reducing a work load to form the third via hole in the first insulating layer, thereby realizing stable and uniform contact between the source/drain layer and the first metal layer. Due to the excellent uniformity of conductivity and good electrical contact of the first metal layer, on the one hand the saturation mobility characteristics of TFT devices are improved without losing the light-shielding characteristics of the first metal layer, and on the other hand, the overall uniformity and high mobility of TFT electrical properties are improved to enhance display quality of the display panels.

BRIEF DESCRIPTION OF DRAWINGS

In order to explain the technical solutions of the present invention more clearly, drawings which will be described in the embodiments are briefly introduced hereinafter. Obviously, the accompanying drawings described below are only some embodiments of the present invention. Persons of ordinary skills in the art are able to obtain other drawings based on these drawings without creative work.

DETAILED DESCRIPTION OF EMBODIMENTS

The reference to "embodiment" in the specific embodiments means that a specific feature, structure, or characteristic described in conjunction with the embodiment may be included in at least one embodiment of the present invention. The same terms appearing in different positions in the specification are not necessarily limited to the same embodiment, but should be understood as an embodiment independent or alternative to other embodiments. Under the enlightenment of the technical solutions disclosed in the embodiments provided by the present invention, those of ordinary skill in the art can change the described embodiments of the present invention or combine other technical solutions based on the concept of the present invention.

A display panel and a manufacturing method of the display panel of the present invention are preferably used in large-sized (e.g. TV) display technology. In particular, in an IGZO TFT process of the present invention, a second insulating layer (GI) in a top gate (TG) is over-etched and an oxide semiconductor layer is conductorized to improve the overall uniformity and high mobility of thin film transistor (TFT) electrical properties, so that the electrical properties of an active layer of an TFT are more stable, thus improving display quality.

Figure 1:
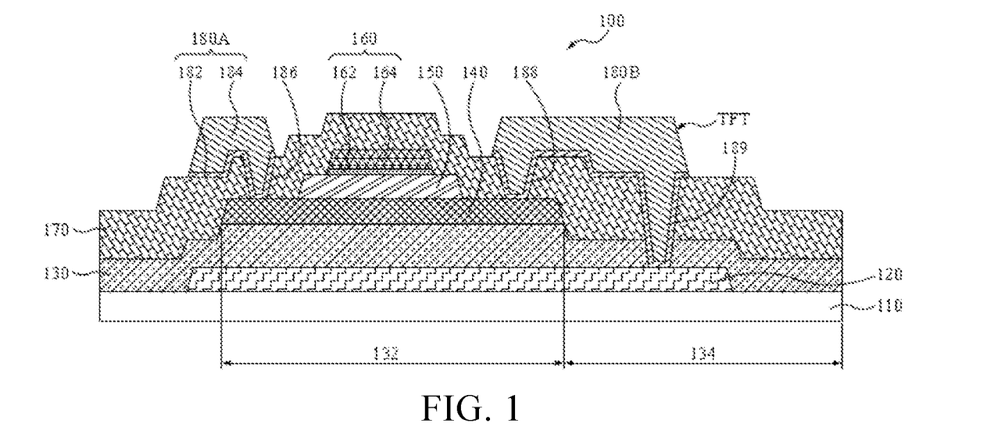
FIG. 1 is a schematic cross-sectional view of a display panel of the present invention.

Please refer to FIG. 1, which shows a schematic cross-sectional view of a display panel 100 of the present invention. As shown in the drawing, the present invention provides the display panel 100, comprising: a substrate 110, a first metal layer 120, a first insulating layer 130, an oxide semiconductor layer 140, a second insulating layer 150, and a second metal layer 160. The first metal layer 120 and the first insulating layer 130 are disposed sequentially on the substrate 110. The first insulating layer 130 comprises a first region 132 and a second region 134 adjacent to the first region 132. An oxide semiconductor layer 140 is disposed on a surface of the first region 132 of the first insulating layer 130 away from the first metal layer 120, wherein a projection of at least a portion of the oxide semiconductor layer 140 projected on the substrate 110 overlaps with a projection of the first metal layer 120 projected on the substrate 110. Specifically, the projection of the oxide semiconductor layer 140 projected on the substrate 110 coincides with the projection of the first metal layer 120 projected on the substrate 110. The first metal layer 120 provides a light shielding function in the display panel 100 to prevent the semiconductor oxide layer 140 from being affected by external light to reduce its conductive properties and stability. Therefore, the projection of the oxide semiconductor layer 140 is entirely projected inside the first metal layer 120.

A second insulating layer 150 is disposed on a surface of the oxide semiconductor layer 140 away from the first insulating layer 130, and a second metal layer 160 and a third insulating layer 170 are disposed sequentially on the second insulating layer 150. A third metal layer 180A, 180B is disposed on a surface of the third insulating layer 170 away from the second metal layer 160. The third metal layer 180A, 180B is electrically connected to the oxide semiconductor layer 140 through a first via hole 186 and a second via hole 188.

In the embodiment shown in FIG. 1, a region where the first insulating layer 130 overlaps with the oxide semiconductor layer 140 is the first region 132, and a region where the first insulating layer 130 does not overlap with the oxide semiconductor layer 140 is the second region 134. A thickness of the second region 134 is less than a thickness of the first region 132, and there is a height difference (not labelled) from 300 Å to 1500 Å.

In the present embodiment, the first metal layer 120 is a shielding metal layer, the first insulating layer 130 is an inorganic buffer layer, the oxide semiconductor layer 140 is an active layer, the second insulating layer 150 is a gate insulating layer, the second metal layer 160 is a gate, the third insulating layer 170 is an inter-layer dielectric (ILD) layer, and the third metal layer 180A, 180B is a source/drain layer.

Figure 10:
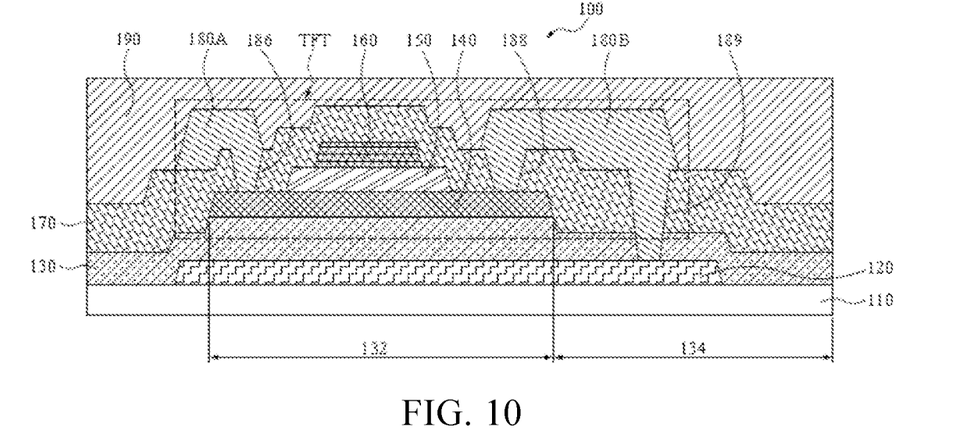
Figure 11:
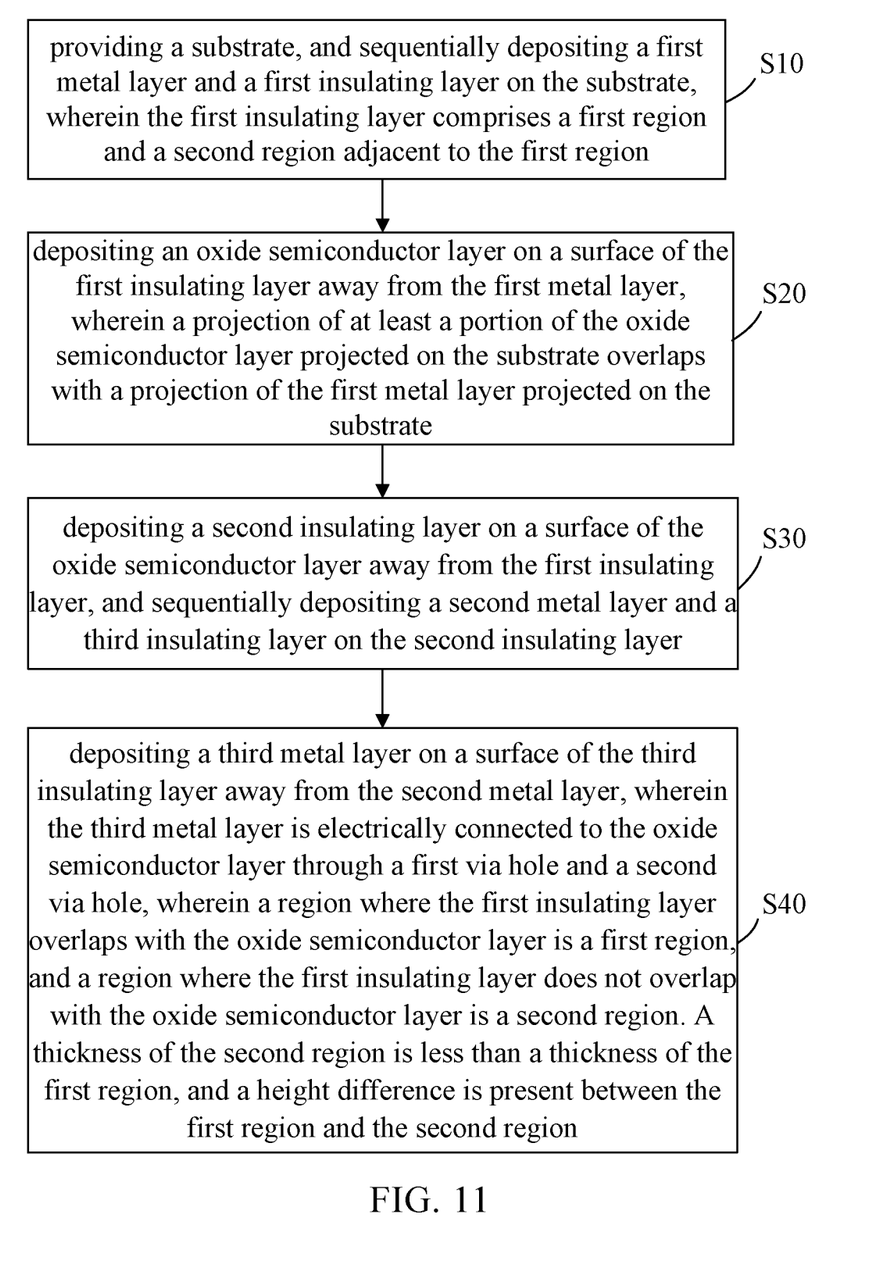
FIG. 11 is a process flow diagram of the manufacturing method of the display panel according to the present invention.

In the embodiment shown in FIG. 1, the display panel 100 further comprises a third via hole 189 defined in the second region 134 and a passivation layer 190 covers the third insulating layer 170 and the third metal layer 180A, 180B (as shown in FIG. 10). The third metal layer 189 is electrically connected to the first metal layer 120 through a third via hole 189, wherein the passivation layer 190 has a thickness of 1000 Å to 5000 Å.

The present application reduces the thickness of the first insulating layer 130 in the second region 134, and at the same time also has a less work load to form the third via hole 189, thereby having a stable and uniform contact between the third metal layer 180B and the first metal layer 120. Further, the second insulating layer 150 with the thickness has certain distribution on the oxide semiconductor layer 140, it is necessary to completely etch the second insulating layer 150 on the oxide semiconductor layer 140 in a contactization region, so the over-etching process is used to thereby obtain excellent uniformity of the oxide semiconductor layer 140 and good electrical contact of the first metal layer 120. On the one hand, the saturation mobility characteristics of TFT devices are enhanced without losing the light-shielding characteristics of the first metal layer 120, and on the other hand, overall uniformity and high mobility of TFT electrical properties are enhanced to improve display quality of the display panel 100.

In particular, the second metal layer 160 further comprises a first transition metal layer 162 and a first metal material portion 164 arranged on the first transition metal layer 162. The third metal layers 180A, 180B comprise a second transition metal portion 182 and a second metal material portion 184 arranged on the second transition metal portion 182. In the present embodiment, the first transition metal layer 162 and the second transition metal portion 182 are preferably made of molybdenum (Mo), titanium (Ti), tungsten (W), chromium (Cr), nickel (Ni), or a combination thereof, and have a thickness of 50 Å to 500 Å to increase adhesion and prevent diffusion to other layers. The first metal material layer 164 and the second metal material portion 184 are preferably made of copper (Cu), aluminum (Al), or other metals with high electrical conductivity. The first metal material layer 164 and the second metal material portion 184 have a thickness of 2000 Å to 5000 Å.

Specifically, in the large-sized display panel 100, copper, aluminum, or other metals with high conductivity need to be used as metal wiring to reduce resistance. Copper, aluminum, or other metals with high conductivity has poor adhesion to silicon oxide. Copper, aluminum, or other metals with high conductivity also diffuse into silicon oxide. Therefore, in order to improve adhesion and stop diffusion, a first transition metal layer 162 and a second transition metal portion 182 are added.

Figure 5:
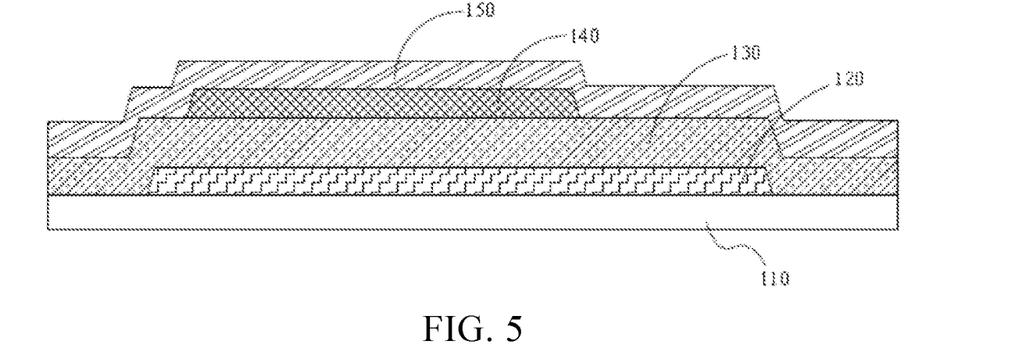
Figure 6:
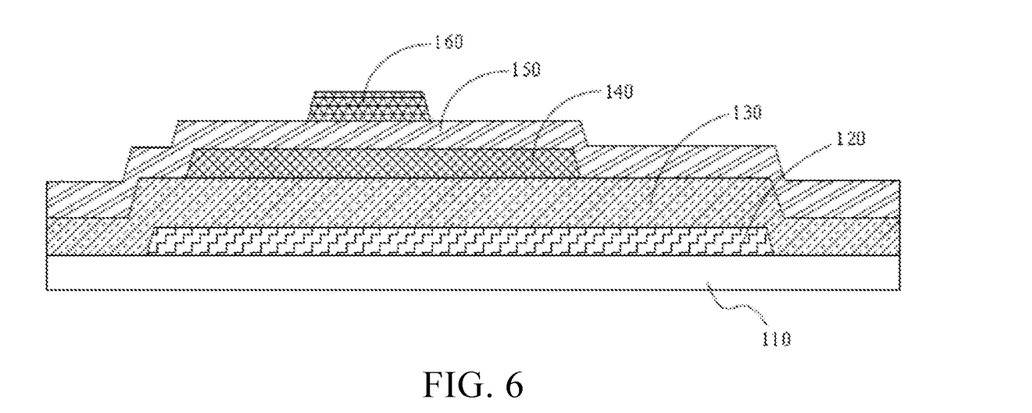
Figure 7:
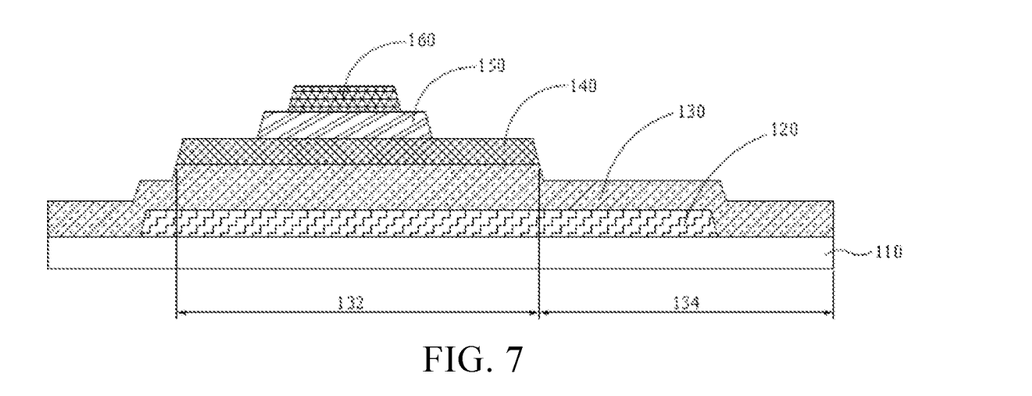

Please refer to FIGS. 2 to 11, the present invention further provides a manufacturing method of a display panel 100 comprising following steps. Step S10: providing a substrate 110, and sequentially depositing a first metal layer 120 and a first insulating layer 130 on the substrate 110. Step S20: depositing an oxide semiconductor layer 140 on a surface of the first insulating layer 130 away from the first metal layer 120. A projection of at least a portion of the oxide semiconductor layer 140 projected on the substrate 110 overlaps with a projection of the first metal layer 120 projected on the substrate 110. Specifically, as shown in FIG. 7, the projection of oxide semiconductor layer 140 projected on the substrate 110 coincides with the projection of the first metal layer 120 projected on the substrate 110.

Step S30: depositing a second insulating layer 150 on a surface of the oxide semiconductor layer 140 away from the first insulating layer 130, and sequentially depositing a second metal layer 160 and a third insulating layer 170 on the second insulating layer 150. Step S40: depositing a third metal layer 180A, 180B on a surface of the third insulating layer 170 away from the second metal layer 160, wherein the third metal layer 180A, 180B is electrically connected to the oxide semiconductor layer 140 through a first via hole 186 and a second via hole 188. A region where the first insulating layer 130 overlaps with the oxide semiconductor layer 140 is a first region 132, and a region where the first insulating layer 130 does not overlap with the oxide semiconductor layer 140 is a second region 134. A thickness of the second region 134 is less than a thickness of the first region 132 and a height difference (not labelled) is present between the first region 132 and the second region 134, which is in a range from 300 Å to 1500 Å.

Figure 2:
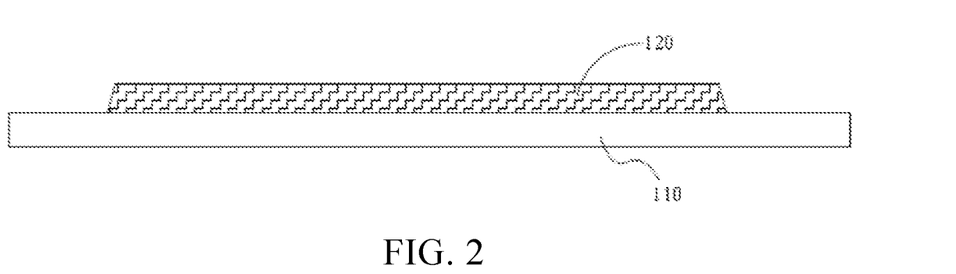
FIGS. 2 to 10 are schematic cross-sectional views of a manufacturing method of a display panel of the present invention.
Figure 3:
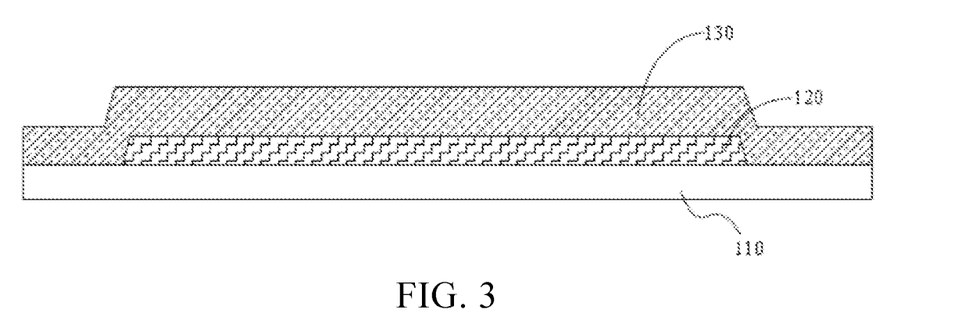

In step S10, the substrate 110 is cleaned first. In step S20, as shown in FIG. 2, a first metal layer 120 (a light shielding metal layer) is deposited on the substrate 110. The first metal layer 120 can be a single layer of molybdenum, titanium, tungsten, chromium, nickel, or a combination thereof, or a double layer which combines two layers selected from the above materials. A thickness of the first metal layer 120 is preferably 1500 Å to 9000 Å. The first metal layer is patterned to define a light shielding area of a thin film transistor TFT and a corresponding wiring area. In step S30, as shown in FIG. 3, the first insulating layer 130 (a buffer layer) is deposited. The first insulating layer 130 can be a single layer of silicon nitride (SixNx), silicon oxide (SiOx), silicon oxide nitride (SiON), or a double layer consisting of two layers selected from the above materials. A thickness of the first insulating layer 130 is preferably 3000 Å to 6000 Å, and the first insulating layer 130 covers the first metal layer 120 and forms the corresponding wiring area.

Figure 4:
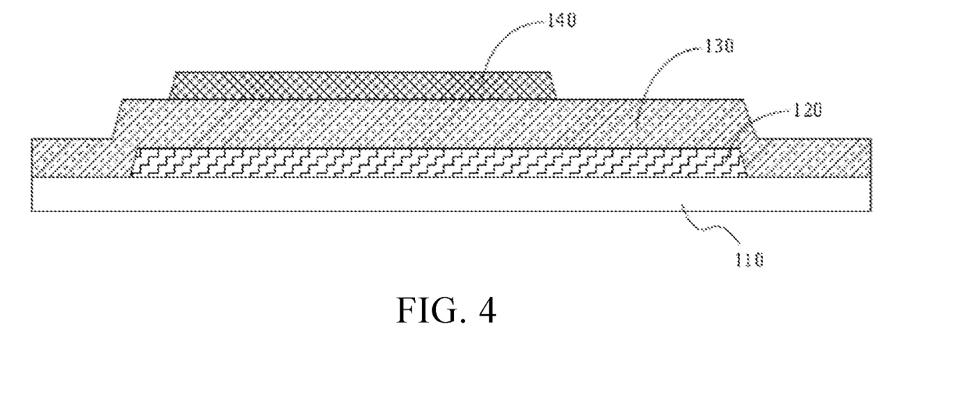

In step S30, as shown in FIG. 4, the oxide semiconductor layer 140 is deposited, and patterned to define an area where an active layer and a capacitor of the thin film transistor TFT are located, preferably with a thickness of 100 Å to 1000 Å. A region where the first insulating layer 130 overlaps with the oxide semiconductor layer 140 is the first area 132 and a region where the first insulating layer 130 does not overlap with the oxide semiconductor layer 140 is the second region 134.

Specifically, as shown in FIG. 5 and FIG. 6, a photomask (not illustrated) is used to define a region of a gate metal layer 160, a wet etching method is used to etch the gate metal layer 160, and then a metal protection layer map is used to dry etch the second insulating layer 150. The second insulating layer 150 is etched using carbon tetrafluoride (Tetrafluoromethane, CF4) gas as the main etching gas to conduct chemical etching. After etching of the GI layer 150 is completed, a certain etching time is increased (over etching) to etch the first insulating layer 130. At this point, because the etching is chemical etching which has film selectivity, the active layer 140 is not etched, only the second region 134 of the first insulating layer 130 is etched, and as a result, finally the thickness of the first region 132 is greater than the thickness of the second region 134. Due to the excellent uniform conductivity of the oxide semiconductor layer 140 and good electrical contact of the first metal layer 120, on the one hand saturation mobility characteristics of the thin film transistor TFT devices is improved without losing the light shielding characteristics of the first metal layer 120, and on the other hand, the thin film transistor TFT has improved overall electrical uniformity and high mobility, thus improving the display quality of the display panel 100.

Figure 8:
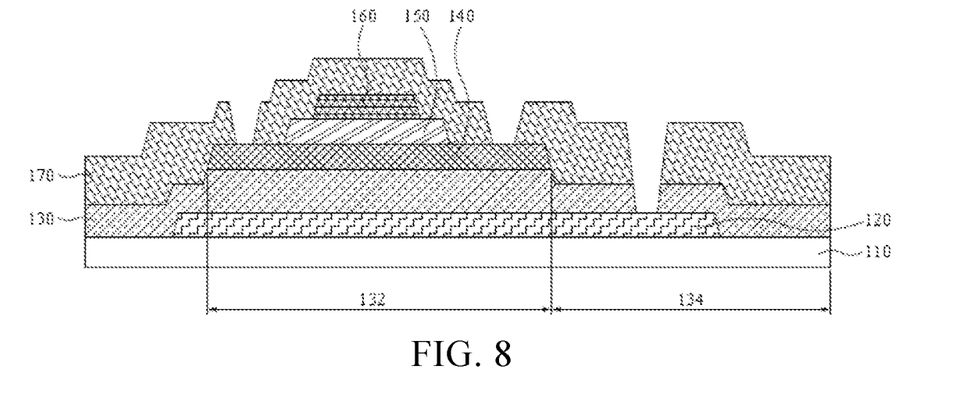

In step S30, as shown in FIG. 8, the display panel 100 further comprises a third via hole 189 defined in the second region 134. The third via hole 189 is electrically connected to the first metal layer 120 through the third insulating layer 170 and the first insulating layer 130. The second insulating layer 150 is used as a gate insulating (GI) layer and preferably has a thickness of 1000 Å to 3000 Å. The second metal layer 160 is used as a gate metal layer, with a double layer structure, as described in detail later. In step S40, the third insulating layer 170 is deposited as a dielectric layer (ILD, e.g., SiOx) and preferably has a thickness of 3000 Å to 10000 Å. Through a patterning process, the first via hole 186 and the second via hole 188 of the third insulating layer 170 are formed by etching to electrically connect the oxide semiconductor layer 140.

Figure 9:
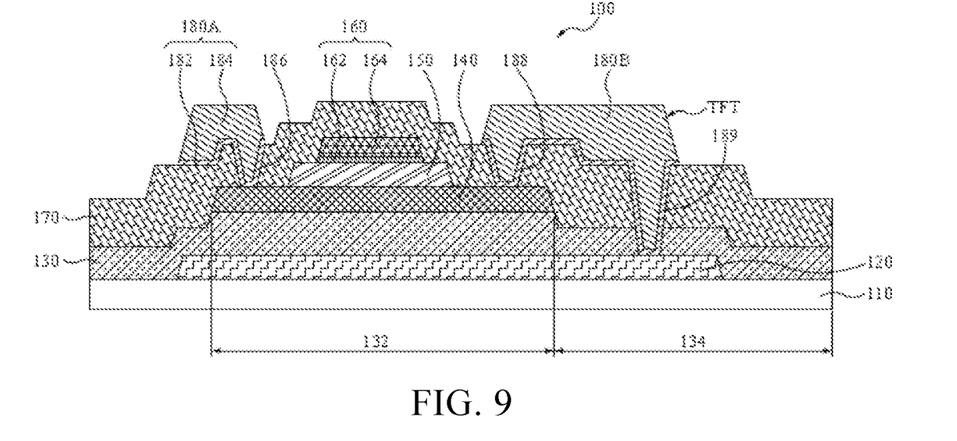

In step S30, as shown in FIG. 8 and FIG. 9, an over-etching process is performed in the second insulating layer 150 to cause a certain degree of etching in the first insulating layer 130. It can be ensured that the second insulating layer 150 is completely etched, so the oxide conductor layer 140 can be formed with high uniformity and high mobility over the entire surface, and as a result, the TFT has highly stable electrical properties, and the display quality of the display panel 100 is effectively improved. In addition, the second region 134 of the second insulating layer 150 undergoes the over-etching process, so a work load to etch and form the third via hole 189 in the first insulating layer 130 can be reduced in subsequent processes, thus ensuring a good contact between the third metal layer 180B and the first metal layer 120, keeping the light-shielding characteristics of the first metal layer 120, and not affecting the saturation mobility characteristics of the TFT.

Specifically, in manufacturing the top gate type IGZO TFT in the present embodiment, over-etching the second insulating layer 150 ensures that the second insulating layer 150 arranged on the oxide semiconductor layer 140 can be completely etched cleanly to realize uniform conductorization of the oxide conductor layer 140. At the same time, the first region 132 and the second region 134 are formed with different thicknesses, and a work load to form the third via hole 189 in the first insulating layer 130 is also reduced. As a result, the present application obtains a stable and uniform contact between the source/drain layer 180B and the first metal layer 120. Furthermore, on the one hand, the saturation mobility characteristics of the TFT device are improved without losing the light-shielding characteristics of the first metal layer 120, and on the other hand, the overall uniformity and high mobility of the electrical properties of the TFT are improved, so the display quality of the display panel 100 can be enhanced.

Specifically, the deposited source/drain metal layer 180A, 180B is a multilayer metal structure like the second metal layer 160 is, as shown in FIG. 9. That is to say, the second metal layer 160 comprises a first transition metal portion 162 and a first metal material portion 164 arranged on the first transition metal portion 162. The first transition metal section 162 is preferably made of molybdenum, titanium, tungsten, chromium, nickel, or a combination thereof, and has a thickness of 50-500 Å. The first metal material portion 164 is preferably made of copper, aluminum, or other highly conductive metal and has a thickness of 2000 Å to 5000 Å. A material of the first metal material portion 164 is copper or aluminum and has a thickness of 2000 Å to 5000 Å.

Similarly, the third metal layer 180A, 180B comprises a second transition metal portion 182 and a second metal material portion 184 arranged on the second transition metal portion 182. A material of the second transition metal portion 182 is molybdenum, titanium, tungsten, chromium, nickel or a combination thereof, and can also be a conductive oxide material such as indium tin oxide (ITO), indium zinc oxide (IZO), or aluminum zinc oxide (AZO), and has a thickness of 50 Å to 500 Å. A material of the second metallic material section 184 is copper, aluminum, or other metals with high electrical conductivity, and a thickness of the second metallic material section 184 is 2000 Å to 10000 Å. The same photomask is then used to define the source/drain metal layer 180A, 180B, a top gate driving TFT, and an adapter layer of the light-shielding metal layer 120, and other metal wiring areas.

After step S40, as shown in FIG. 10, a passivation layer 190 (PV, e.g., SiOx) is deposited in the present embodiment, and preferably has a thickness from 1000 to 5000 Å. A through hole (not labelled) is etched out. Then, an organic planarization layer is deposited for planarizing a surface of the display panel 100. After that, the through hole is formed by photolithography (yellow light), a first electrode (not illustrated) is produced for contacting an OLED light-emitting device (not illustrated), patterning is performed to deposit a pixel definition layer (not illustrated), and a light-emitting area is defined by photolithography to complete production of a driving back panel.

In the present invention, the over-etching process is performed in the second insulating layer 150 to cause a certain degree of etching in the first insulating layer 130. It can be ensured that the second insulating layer 150 is completely etched, so the oxide conductor layer 140 can be formed with high uniformity and high mobility over the entire surface, and as a result, the TFT has highly stable electrical properties, and the display quality of the display panel 100 is effectively improved. In addition, the second region 134 of the second insulating layer 150 undergoes the over-etching process, so a work load to etch and form the third via hole 189 in the first insulating layer 130 can be reduced in subsequent processes, thus ensuring a good contact between the third metal layer 180B and the first metal layer 120, keeping the light-shielding characteristics of the first metal layer 120, and not affecting the saturation mobility characteristics of the TFT.

Specifically, in manufacturing the top gate type IGZO TFT in the present embodiment, over-etching the second insulating layer 150 ensures uniform conductorization of the oxide conductor layer 140. At the same time, the first region 132 and the second region 134 are formed with different thicknesses, and a work load to form the third via hole 189 in the first insulating layer 130 is also reduced. As a result, the present application obtains a stable and uniform contact between the source/drain layer 180B and the first metal layer 120. Furthermore, due to excellent uniform conductrization and good electrical contact of the first metal layer 120, on the one hand the saturation mobility characteristics of the TFT device are improved without losing the light-shielding characteristics of the first metal layer 120, and on the other hand, the overall uniformity and high mobility of the electrical properties of the TFT are improved, so the display quality of the display panel 100 can be enhanced.

In summary, although the present invention is described in connection with its specific embodiments, it should be understood that many alternatives, modifications and variations will be apparent to those skilled in the art. Accordingly, the present invention comprises all substitutions, modifications and variations that fall within the scope of the appended claims.

What is claimed is:

1. A display panel, comprising:
   a substrate, wherein a first metal layer and a first insulating layer are disposed sequentially on the substrate, the first insulating layer comprises a first region and a second region adjacent to the first region, and a thickness of the second region is less than a thickness of the first region;
   an oxide semiconductor layer disposed on a surface of the first region of the first insulating layer away from the first metal layer, wherein a projection of at least a portion of the oxide semiconductor layer projected on the substrate overlaps with a projection of the first metal layer projected on the substrate;
   a second insulating layer disposed on a surface of the oxide semiconductor layer away from the first insulating layer, wherein a second metal layer and a third insulating layer are disposed sequentially on the second insulating layer, the third insulating layer covers the second metal layer, the second insulating layer, the oxide semiconductor layer, and the first insulating layer; and
   a third metal layer disposed on a surface of the third insulating layer away from the second metal layer, wherein the third metal layer is electrically connected to the oxide semiconductor layer through a first via hole and a second via hole, the third metal layer is connected to the first metal layer through a third via hole in the second region, and the third via hole is extended through the first insulating layer and the third insulating layer.

2. The display panel according to claim 1, wherein the first metal layer is a shielding metal layer, the first insulating layer is an inorganic buffer layer, the oxide semiconductor layer is an active layer, the second insulating layer is a gate insulating layer, the second metal layer is a gate, the third insulating layer is an inter-layer dielectric layer, and the third metal layer is a source/drain layer.

3. The display panel according to claim 1, wherein the second metal layer comprises a first transition metal portion and a first metal material portion arranged on the first transition metal portion.

4. The display panel according to claim 3, wherein a material of the first transition metal portion is molybdenum, titanium, tungsten, chromium, nickel, or a combination thereof, and a material of the first metal material portion is copper or aluminum.

5. The display panel according to claim 1, wherein the third metal layer comprises a second transition metal portion and a second metal material portion arranged on the second transition metal portion.

6. The display panel according to claim 5, wherein a material of the second transition metal portion is molybdenum, titanium, tungsten, chromium, nickel, or a combination thereof, and a material of the second metal material portion is copper or aluminum.

7. The display panel according to claim 1, further comprising a passivation layer covering the third insulating layer and the third metal layer, and the passivation layer having a thickness of 1000 Å to 5000 Å.

8. The display panel according to claim 1, wherein the projection of the oxide semiconductor layer projected on the substrate coincides with the projection of the first metal layer projected on the substrate.

9. A manufacturing method of a display panel, comprising following steps:
   providing a substrate on which a first metal layer and a first insulating layer are sequentially deposited, wherein the first insulating layer comprises a first region and a second region adjacent to the first region, and a thickness of the second region is less than a thickness of the first region;
   depositing an oxide semiconductor layer on a surface of the first region of the first insulating layer away from the first metal layer, wherein a projection of at least one portion of the oxide semiconductor layer projected on the substrate overlaps with a projection of the first metal layer projected on the substrate;
   depositing a second insulating layer on a surface of the oxide semiconductor layer away from the first insulating layer, and sequentially depositing a second metal layer and a third insulating layer on the second insulating layer; and
   depositing a third metal layer on a surface of the third insulating layer away from the second metal layer, wherein the third metal layer is electrically connected to the oxide semiconductor layer through a first via hole and a second via hole, wherein the third metal layer is connected to the first metal layer through a third via hole defined in the second region, and the third via hole is extended through the first insulating layer and the third insulating layer.

10. The manufacturing method of the display panel according to claim 9, wherein the first metal layer is a shielding metal layer, the first insulating layer is an inorganic buffer layer, the oxide semiconductor layer is an active layer, the second insulating layer is a gate insulating layer, the second metal layer is a gate, the third insulating layer is an inter-layer dielectric layer, and the third metal layer is a source/drain layer.

11. The manufacturing method of the display panel according to claim 9, wherein the second metal layer comprises a first transition metal portion and a first metal material portion arranged on the first transition metal portion.

12. The manufacturing method of the display panel according to claim 11, wherein a material of the first transition metal portion is molybdenum, titanium, tungsten, chromium, nickel, or a combination thereof and has a thickness of 50 Å to 500 Å, and a material of the first metal material portion is copper or aluminum and has a thickness of 2000 Å to 5000 Å.

13. The manufacturing method of the display panel according to claim 9, wherein the third metal layer comprises a second transition metal portion and a second metal material portion arranged on the second transition metal portion.

14. The manufacturing method of the display panel according to claim 13, wherein a material of the second transition metal portion is molybdenum, titanium, tungsten, chromium, nickel, or a combination thereof and has a thickness of 50 Å to 500 Å, and a material of the second metal material portion is copper or aluminum and has a thickness of 2000 Å to 10000 Å.

15. The manufacturing method of the display panel according to claim 9, further comprising a passivation layer covering the third insulating layer and the third metal layer, and the passivation layer having a thickness of 1000 Å to 5000 Å.

16. The manufacturing method of the display panel according to claim 9, wherein the projection of the oxide semiconductor layer projected on the substrate coincides with the projection of the first metal layer projected on the substrate.

* * * * *